United States Patent [19]
Furuya et al.

[11] Patent Number: 5,869,989
[45] Date of Patent: Feb. 9, 1999

[54] AMPLIFYING ELECTRONIC CIRCUIT WITH STABLE IDLING CURRENT

[75] Inventors: Misao Furuya; Seiji Takamatu, both of Atsugi, Japan

[73] Assignee: Mitsumi Electric Company, Ltd., Tokyo, Japan

[21] Appl. No.: 739,875

[22] Filed: Oct. 31, 1996

[30] Foreign Application Priority Data

Nov. 2, 1995 [JP] Japan .................................. 7-286223

[51] Int. Cl.$^6$ .............................. H03F 3/30; H03F 3/45
[52] U.S. Cl. ........................ 327/112; 327/560; 330/268; 323/315
[58] Field of Search .................................... 327/560, 112, 327/111, 512, 513, 551, 170, 108; 330/268, 267, 266, 255, 262, 263; 323/315

[56] References Cited

U.S. PATENT DOCUMENTS

| | | | |
|---|---|---|---|
| 3,997,849 | 12/1976 | Thommen | 330/265 |
| 4,004,242 | 1/1977 | Wheatley, Jr. | 327/58 |
| 4,163,908 | 8/1979 | Price | 330/267 |
| 4,540,951 | 9/1985 | Ozawa et al. | 330/267 |
| 4,570,128 | 2/1986 | Monticelli | 330/264 |
| 4,935,703 | 6/1990 | Poletto | 330/267 |
| 5,144,259 | 9/1992 | Yoshida | 330/267 |
| 5,343,165 | 8/1994 | Kordts et al. | 330/262 |
| 5,479,133 | 12/1995 | Dow | 330/267 |

*Primary Examiner*—Timothy P. Callahan
*Assistant Examiner*—Terry L. Englund
*Attorney, Agent, or Firm*—Michael N. Meller

[57] ABSTRACT

The semiconductor types of first and second semiconductor type transistors are different from one another and the two transistors are connected in series. An input signal is supplied to each of the bases of the first and second transistors. Each of the collector electric currents of the first and second transistors are thus controlled. An output is provided from the inter-connection point of the first and second transistors. A third transistor supplies the collector electric current which is $1/K_1$ times the collector electric current of the second transistor, where $K_1$ is the current-mirror ratio between the second and third transistors. A fourth transistor has the collector and base connected with one another. The fourth transistor supplies an electric current according to the collector electric current of the third transistor. A fifth transistor has the base electric current controlled by the base electric current of the fourth transistor. The fifth transistor supplies its collector electric current, which is $K_2$ times the collector electric current of the fourth transistor, to the base of the first transistor, where $K_2$ is the current-mirror ratio between the fourth and fifth transistors.

6 Claims, 6 Drawing Sheets

TEMPERATURE

FIG. 3
PRIOR ART

POWER-SUPPLY-VOLTAGE $V_{CC}$

AMPLIFYING ELECTRONIC CIRCUIT WITH STABLE IDLING CURRENT

BACKGROUND OF THE INVENTION

1. Field of the Invention

The present invention relates to an amplifying electronic circuit, and, in particular, to an amplifying electronic circuit having a single-end push-pull formation output.

2. Description of the Related Art

Figure 1:
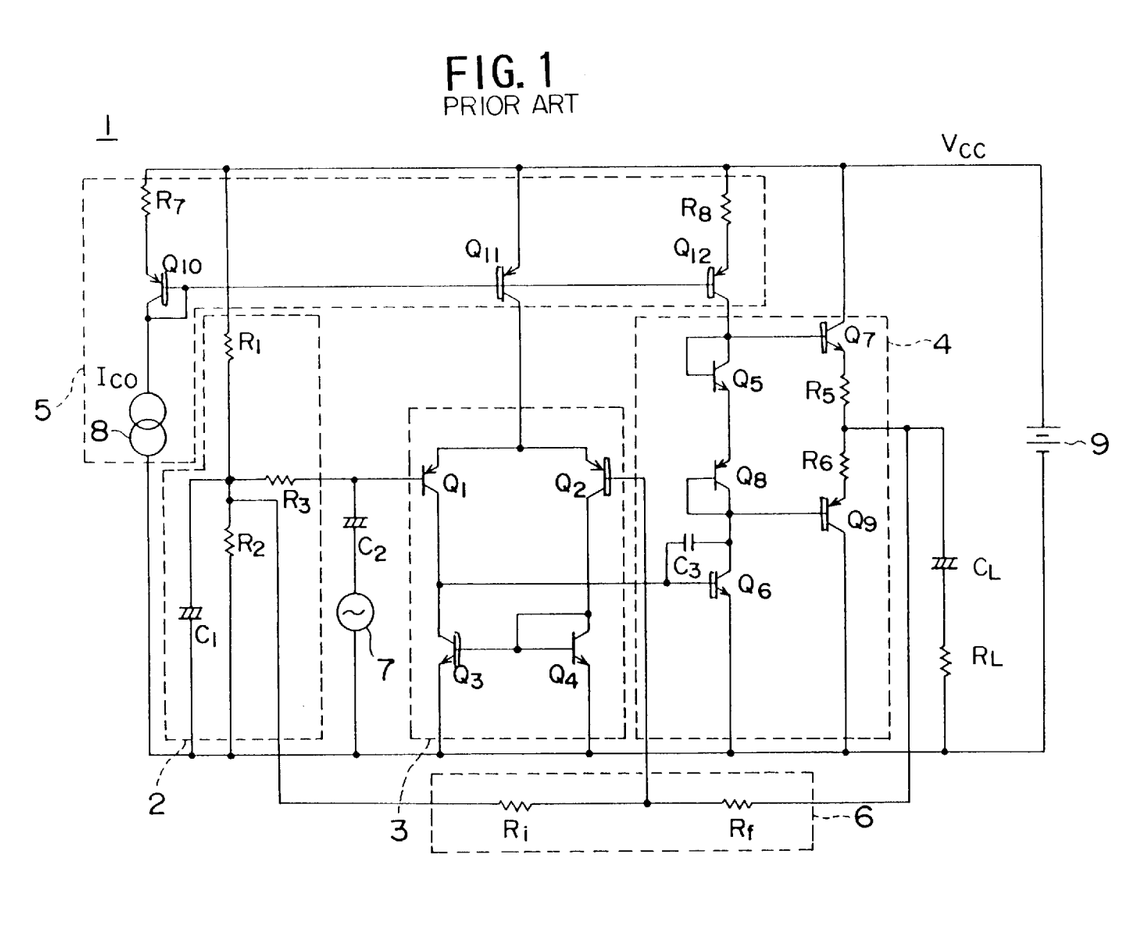
FIG.1 shows a circuit diagram of an example of the related art.

FIG.1 shows an amplifying electronic circuit in an example of the related art. This amplifying electronic circuit 1 includes a bias circuit portion 2 which applies a bias to an input signal, a differential amplifying circuit portion 3 which amplifies the input signal, an output circuit portion 4 which outputs the amplified input signal, a constant-electric-current circuit portion 5 which supplies driving constant electric currents to the differential amplifying circuit portion 3 and the output circuit portion 4, and feedback circuit portion 6 which controls the amount of feedback.

The bias circuit portion 2 includes resistors $R_1$, $R_2$, $R_3$, and a ripple removing capacitor $C_1$. A signal source 7 supplies a signal, to be amplified, to the bias circuit portion 2 via a direct-electric-current removing capacitor $C_2$. The bias circuit portion 2 applies a bias to the thus-supplied signal, and supplies the signal to the differential amplifying circuit portion 3.

The differential amplifying circuit portion 3 includes PNP transistors $Q_1$ and $Q_2$ which act as input transistors, and NPN transistors $Q_3$ and $Q_4$ which act as a driving electric current source. The input signal, which has a bias applied thereto by the bias circuit portion 2, is supplied to the base of the input PNP transistor $Q_1$. An output signal, which is controlled by the feedback circuit portion 6 is supplied to the base of the other input PNP transistor $Q_2$. The differential amplifying circuit portion 3 noninverting-amplifies the input signal and then supplies it to the output circuit portion 4.

The output circuit portion 4 includes NPN transistors $Q_5$, $Q_6$, $Q_7$, PNP transistors $Q_8$, $Q_9$, resistors $R_6$, $R_5$, and a capacitor $C_3$. The output circuit portion 4 is a push-pull output circuit, power-amplifies the signal supplied by the differential amplifying circuit portion 3, and outputs the amplified signal to a load capacitor $C_L$ and a load resistor $R_L$. During this operation, an electric current for generating an idling electric current is always supplied to the output circuit portion 4 from the constant-electric-current circuit portion 5 in order to prevent a crossover distortion from occurring around the cut-off levels of the NPN transistor $Q_7$ and the PNP transistor $Q_9$.

The feedback circuit portion 6 includes resistors $R_f$ and $R_i$. The resistor $R_f$ is connected between the output node of the output circuit portion 4 and the base of the PNP transistor $Q_2$ which acts as the input transistor of the differential amplifying circuit portion 3. The other resistor $R_i$ is connected between the resistor $R_f$ and the inter-connection point of the resistors $R_1$, $R_2$ and $R_3$ of the bias circuit portion 2. Thereby, the differential amplifying circuit portion 3 is configured as being a noninverting amplifying circuit.

The constant-electric-current circuit portion 5 includes a constant-current source 8, PNP transistors $Q_{10}$, $Q_{11}$, $Q_{12}$, and resistors $R_7$, $R_8$. The constant-electric-current circuit portion 5 includes a current-mirror circuit. A power-supply voltage Vcc is supplied by a power supply 9 to the constant-electric-current circuit portion 5. The constant-electric-current circuit portion 5 generates a driving electric current from the supplied power-supply voltage Vcc, and supplies the driving electric current to the differential amplifying circuit portion 3 and the output circuit portion 4.

Setting of the idling electric current in the output circuit portion 4 will now be described. In the output circuit portion 4, each of an emitter area ratio between the transistors $Q_5$ and $Q_7$ and an emitter area ratio between the transistors $Q_8$ and $Q_9$ is assumed as being 'n'. Further, symbols will be used for various factors as follows:

the base-emitter voltage of the transistor $Q_5$: $V_{BE5}$;

the base-emitter voltage of the transistor $Q_7$: $V_{BE7}$;

the base-emitter voltage of the transistor $Q_8$: $V_{BE8}$;

the base-emitter voltage of the transistor $Q_9$: $V_{BE9}$;

the emitter electric current of the transistor $Q_5$: $I_{E5}$;

the emitter electric current of the transistor $Q_7$: $I_{E7}$;

the emitter electric current of the transistor $Q_8$: $I_{E8}$; and the emitter electric current of the transistor $Q_9$: $I_{E9}$.

It is assumed that the amplification factor $h_{FE}$ of each transistor is $h_{FE} \gg 1$. Thereby, a base electric current can be considered to be zero with respect to a collector electric current and a base electric current can be considered to be zero with respect to an emitter electric current. A feedback current $i_f$ is assumed such that $i_f \ll I_{E7}$.

$$V_{BE5}+V_{BE8}=V_{BE7}+R_5 \cdot I_{E7}+R_6 \cdot I_{E9}+V_{BE9}=V_{BE7}+V_{BE9}+(R_5+R_6)\cdot I_{E9} \quad (1)$$

The NPN transistors $Q_5$, $Q_7$ and the PNP transistor $Q_8$, $Q_9$ are assumed as being configured such that the NPN transistors $Q_5$, $Q_7$ are symmetrical with the PNP transistor $Q_8$, $Q_9$. Further, it is also assumed that $R_5=R_6$. Thereby, it is possible that the emitter electric current $I_{E7}$ of the transistor $Q_7$ is equal to the emitter electric current $I_{E9}$ of the transistor $Q_9$. Further, it is enough to consider a relationship between the transistor $Q_5$ and the transistor $Q_7$ when the above-mentioned equation (1) is considered.

Therefore, when the equation (1) is considered, it is enough to consider only the following equation (2):

$$V_{BE5}=V_{BE7}+R_5 I_{E7} \quad (2).$$

Generally speaking, the base-emitter voltage $V_{BE}$ of a transistor is expressed by the following equation (3):

$$V_{BE}=V_T \cdot ln[I_C/\{(1+V_{CE}/V_A)\cdot I_S\}] \quad (3);$$

where:

$V_T$: the thermal voltage (VT can be expressed as $V_T=kT/q$, and $V_T \approx 26$ mV, where the temperature thereof is 25° C.);

$I_C$: the collector electric current;

$I_S$: reverse-direction collector saturation current (being in proportion to the emitter area);

$V_{CE}$: the collector-emitter voltage; and $V_A$: the Early voltage.

When the equation (2) is rewritten using the equation (3), $$V_T \cdot ln[I_{C5}/\{(1+V_{CE5}/V_{AS})\cdot I_{SS}\}] = \quad (4)$$

$$V_T \cdot ln[I_{C7}/\{(1+V_{CE7}/V_{A7})\cdot I_{SS}\}] + R_5 \cdot I_{C7}.$$

(Because it is considered that the base electric current is substantially zero with respect to the collector electric current and with respect to the emitter electric current as mentioned above, it is possible that $I_{C7}$ can be considered to be equal to $I_{E7}$.)

$$V_T \cdot \ln[I_{C7}/\{(1 + V_{CE7}/V_{A7}) \cdot I_{S7}\}] - \quad (5)$$

$$V_T \cdot \ln[I_{CS}/\{(1 + V_{CES}/V_{AS}) \cdot I_{SS}\}] = R_5 \cdot I_{C7}.$$

The equation (5) can become the following equation (6):

$$V_T \cdot \ln\{I_{C7}/I_{CS} \cdot (1+V_{CE7}/V_{A7})/(1+V_{CES}/V_{AS}) \cdot I_{S7}/I_{SS}\} = R_5 \cdot I_{C7} \quad (6).$$

In the equation (6), $I_{S7}/I_{S5}$ corresponds to the above-mentioned area ratio 'n'. Further, the collector current $I_{C5}$ of the transistor $Q_5$ is approximately equal to the collector current $I_{C12}$ of the transistor $Q_{12}$ which supplies an electric current to the transistor $Q_5$. Thereby, the equation (6) becomes the following equation (7):

$$V_T \cdot \ln[\{I_{C7}/I_{C12} \cdot (1+V_{CE7}/V_{A7})/(1+V_{CES}/V_{AS})\} \cdot n] = R_5 \cdot I_{C7} \quad (7).$$

Generally speaking, in a power amplifier or the like, setting is performed such that an output electric current flows in an amount 100 times to 1000 times the idling electric current. The value of $R_5 \cdot I_{C7}$ in the equation (7) is as small as tens of millivolts according to a design of such a semiconductor device.

It is assumed that $V_T \cdot \ln\{I_{C7}/I_{C12} \cdot (1+V_{CES}/V_{AS})/(1+V_{CE7}/V_{A7})\}$ in the equation (7) is sufficiently larger than $R_5 \cdot I_{C7}$. That is, $$V_T \cdot \ln\{I_{C7}/I_{C12} \cdot (1+V_{CES}/V_{AS})/(1+V_{CE7}/V_{A7})\} >> R_5 \cdot I_{C7} \quad (8).$$

It is possible that the following equation (9) is obtained;

$$I_{C7} = I_{C12} \cdot \{(1+V_{CES}/V_{AS})/(1+V_{CE7}/V_{A7})\} \quad (9).$$

A diode connection is performed for the transistor $Q_5$. Therefore, $V_{CE5}$ is equal to $V_{BE5}$. $V_{BE5} \approx 0.7$ (V), and is constant. Therefore, $V_{BE5}$ does not substantially depend on the power-supply voltage.

$$V_{CE7} \approx (\tfrac{1}{2})Vcc \quad (10).$$

This is because, generally, in a single-end push-pull electronic circuit, an output center voltage $V_{OUT}$ is set to $(\tfrac{1}{2})Vcc$.

In the above-mentioned equation (9), the collector electric current $I_{C7}$ of the transistor $Q_7$, which current corresponds to the idling electric current, is obtained from the following equations (11) (corresponding to the above equation (9) ):

$$I_{C7} = K \cdot I_{C12} (1+V_{CE7}/V_{A7}) \quad (11),$$

where
$K = 1/(1+V_{CES}/V_{AS})$.

Thus, in the related art, the idling electric current $I_{C7}$ is determined from the collector current of the transistor $Q_{12}$ which supplies the driving electric current, the emitter area ratio between the transistor $Q_5$ and transistor $Q_7$, and resistance values of the resistors $R_5$ and $R_6$.

Figure 2:
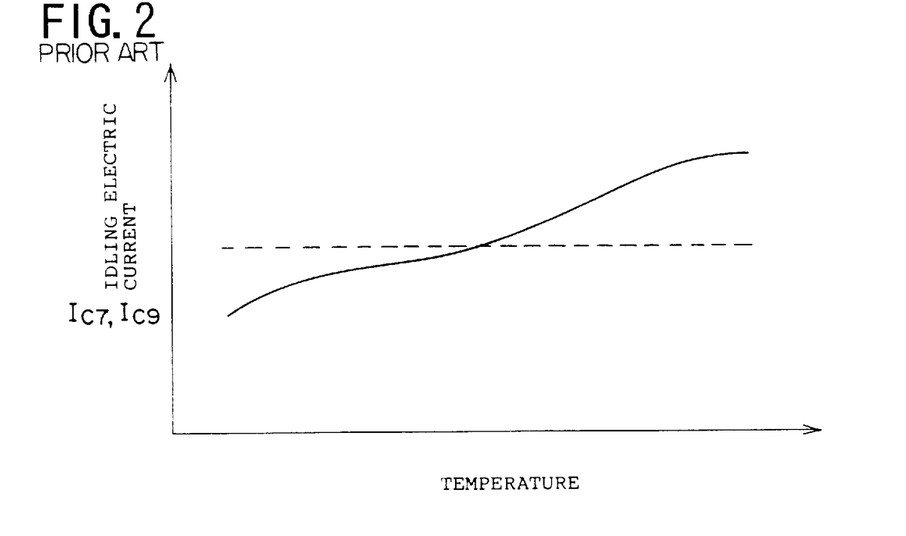
FIG.2 shows characteristics of an idling electric current with respect to the temperature of the device in the related art.

FIG.2 shows characteristics of the idling electric current with respect to the temperature of the device in the related art.

As shown in FIG.2, the idling electric current tends to increase as the temperature of the device increases.

Figure 3:
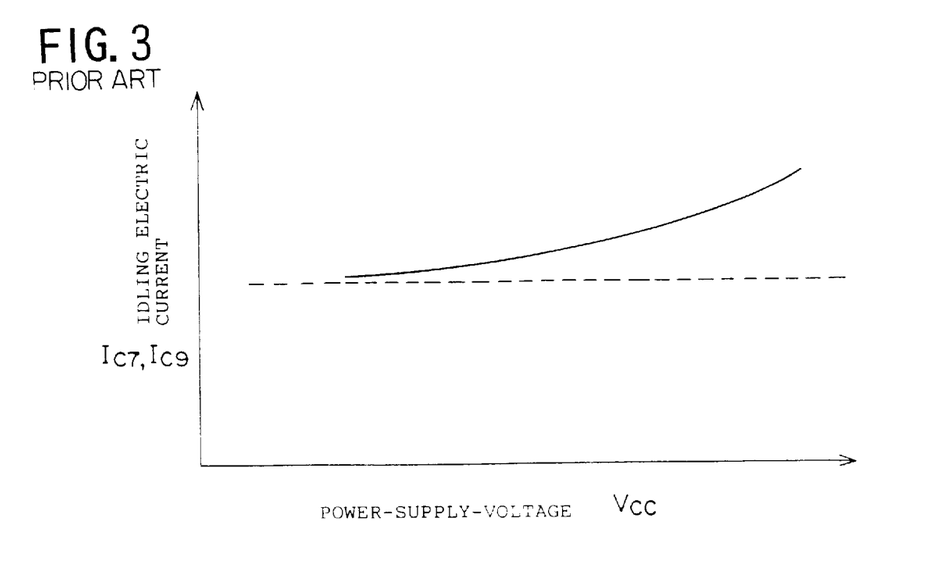
FIG.3 shows characteristics of the idling electric current with respect to a power-supply voltage in the related art.

FIG.3 shows characteristics of the idling electric current with respect to the power-supply voltage in the related art.

As shown in FIG.3, the idling electric current increases as the power-supply voltage Vcc increases. As shown in the equation (10), $V_{CE7}$ depends on the power-supply voltage Vcc. As shown in the equation (11), the idling electric current depends on $V_{CE7}$. Therefore, the idling electric current depends on the power-supply voltage.

In the related art, the idling electric current being supplied to the output transistors in the output circuit portion varies depending on the temperature of the device and power-supply voltage as discussed above. Thereby, it is not possible to provide a stable output signal.

SUMMARY OF THE INVENTION

An object of the present invention is to provide an amplifying electronic circuit in which a stable operation is provided without regard to ambient conditions.

An amplifying electronic circuit according to the present invention comprises:

first and second transistors which have semiconductor types different from one another and are connected in series, an input signal being supplied to each of the bases of the first and second transistors, each of the collector electric currents of the first and second transistors being controlled, an output being provided from the inter-connection point of the first and second transistor; and a current-mirror circuit for controlling the base electric current of the first transistor according to the base electric current supplied to the second transistor.

The current-mirror circuit controls the base electric current of the first transistor according to the base electric current supplied to the second transistor, as mentioned above. Thereby, an idling electric current flowing through the first and second transistors is appropriately controlled. As a result, the idling electric current value is determined from a set constant current and a current mirror ratio. Accordingly, it is possible to improve stability of the idling electric current.

The current-mirror circuit comprises:

- a third transistor which supplies the collector electric current which is $1/K_1$ times the collector electric current of the second transistor where $K_1$ is the current-mirror ratio between the second and third transistors;
- a fourth transistor having the collector and base connected with one another, the fourth transistor supplying an electric current according to the collector electric current of the third transistor; and
- a fifth transistor, the base electric current of which is controlled by the base electric current of the fourth transistor, the fifth transistor supplying the collector electric current which is $K_2$ times the collector electric current of the fourth transistor to the base of the first transistor.

In such a configuration, the idling electric current $I_{C2}$ flowing through the second transistor and the collector electric current $I_{C3}$ of the third transistor have the following relationship:

$$I_{C2} = K_2 I_{C3},$$

where $K_2$ is the current-mirror ratio between the fourth and fifth transistors.

The collector electric current $I_{C4}$ of the fourth transistor and the collector electric current $I_{C5}$ of the fifth transistor have the following relationship:

$$I_{C5} = K_1 I_{C4}.$$

Because $I_{C3} \approx I_{C4}$, $$I_{C2} = K_2 I_{C3} \approx (K_2/K_1) I_{C5}.$$

$I_{C5}$ is set by driving electric currents which drive the amplifying electronic circuit. Therefore, when the driving electric currents are stable, the idling current is determined by $K_1$, $K_2$. The current mirror ratios $K_1$ and $K_2$ are emitter area ratios between the second and third transistors and between the fourth and fifth transistors, respectively. Therefore, the idling electric current is not likely to be affected by the temperature of the device and is not likely to be affected by the power-supply voltage. Accordingly, it is possible to allow the amplifying electronic circuit to stably operate.

Other objects and further features of the present invention will become more apparent from the following detailed description when read in conjunction with the accompanying drawings.

DETAILED DESCRIPTIONS OF PREFERRED EMBODIMENTS

Figure 4:
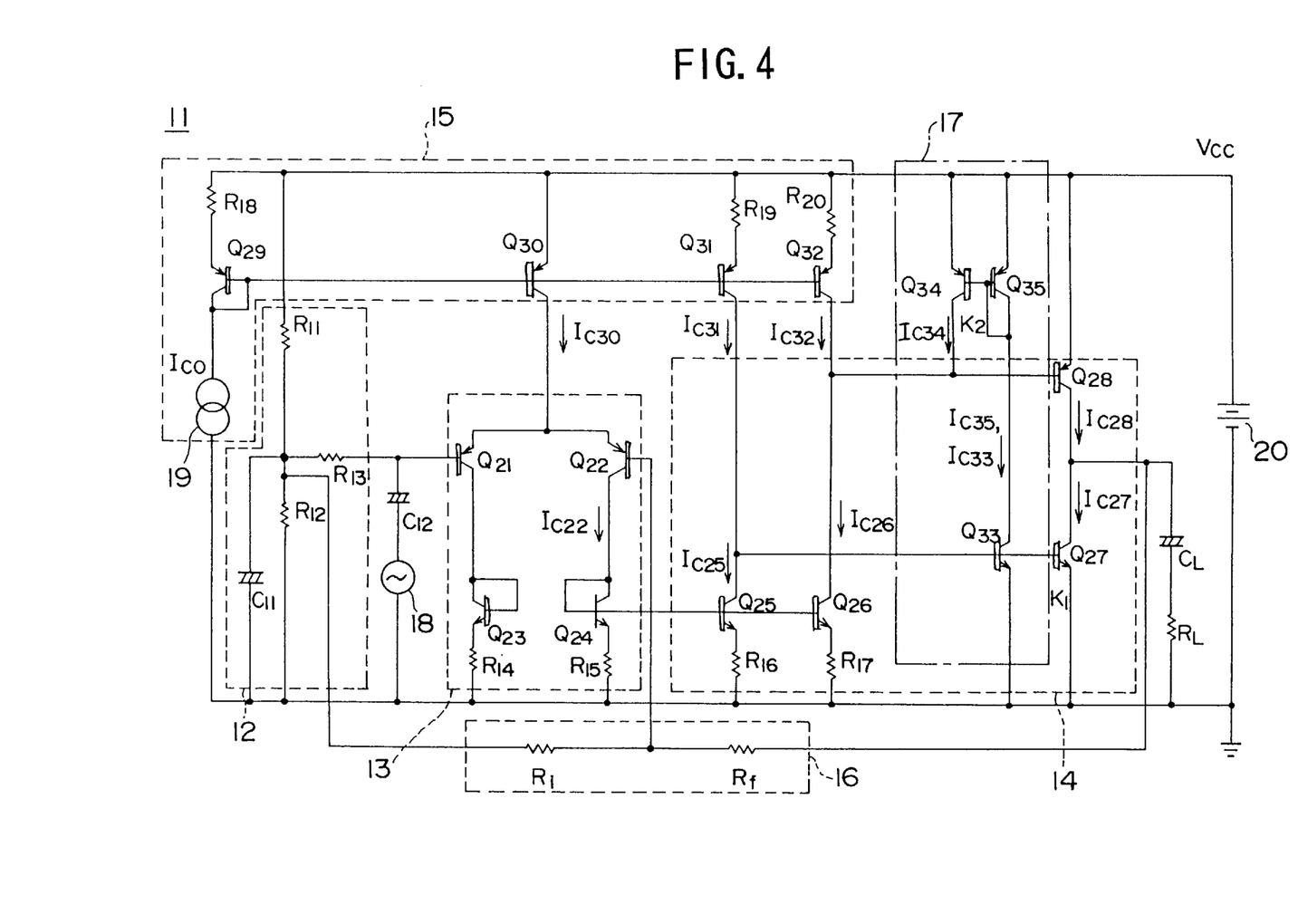
FIG.4 shows a circuit diagram of a first embodiment of the present invention.

FIG.4 shows a circuit diagram of a first embodiment of the present invention. The amplifying electronic circuit 11 in the first embodiment includes a bias circuit portion 12 for applying a bias to an input signal, a differential amplifying circuit portion 13 which amplifies the input signal, an output circuit portion 14 which performs power amplification on a received signal, a constant-electric-current circuit portion 15 which supplies driving constant electric currents to the differential amplifying circuit portion 13 and to the output circuit portion 14, a feedback circuit portion 16 for controlling feedback, and a current-mirror circuit 17 for setting an idling electric current of the output circuit portion 14.

The bias circuit portion 12 includes resistors $R_{11}$, $R_{12}$, $R_{13}$, and a ripple removing capacitor $C_{11}$. A signal source 18 supplies a signal to be amplified to the bias circuit portion 12 via a direct-current removing capacitor $C_{12}$. The bias circuit portion 12 applies a bias to the supplied signal, and provides the signal to the differential amplifying circuit portion 13.

The differential amplifying circuit portion 13 includes PNP transistors $Q_{21}$ and $Q_{22}$ which act as input transistors, NPN transistors $Q_{23}$ and $Q_{24}$ which act as a driving electric current source, and resistors $R_{14}$ and $R_{15}$. The input signal, which has the bias applied thereto by the bias circuit portion 12 as mentioned above, is supplied to the base of the input PNP transistor $Q_{21}$. An output signal, which has undergone control by the feedback circuit portion 16 is supplied to the base of the other input PNP transistor $Q_{22}$. The differential amplifying circuit portion 13 performs noninverting-amplification on the input signal and then supplies the signal to the output circuit portion 14.

The output circuit portion 14 includes NPN transistors $Q_{25}$, $Q_{26}$, $Q_{27}$, a PNP transistor $Q_{28}$, and resistors $R_{16}$, $R_{17}$. The output circuit portion 14 is configured as being a push-pull output electronic circuit. The output circuit portion 14 performs power amplification on the received signal, and provides the signal to a load capacitor $C_L$ and a load resistor $R_L$. During the amplification operation, the current-mirror circuit 17 always supplies an electric current for generating the idling electric current to the output circuit portion 14 in order to prevent crossover distortion from occurring around the cut-off levels of the NPN transistor $Q_{27}$ and PNP transistor $Q_{28}$.

The feedback circuit portion 16 includes resistors $R_f$ and $R_i$. The resistor $R_f$ is connected between the output node of the output circuit portion 14 and the base of the PNP transistor $Q_{22}$ which acts as the input transistor of the differential amplifying circuit portion 13. The other resistor $R_i$ is connected between the resistor $R_f$ and the interconnection point of the resistors $R_{11}$, $R_{12}$ and $R_{13}$ of the bias circuit portion 2. Thereby, the differential amplifying circuit portion 13 is configured as being a noninverting amplifying electronic circuit.

The constant-electric-current circuit portion 15 includes a constant-current source 19, PNP transistors $Q_{29}$, $Q_{30}$, $Q_{31}$, $Q_{32}$, and resistors $R_{18}$, $R_{19}$, $R_{20}$. The constant-electric-current circuit portion 15 is configured as being a current-mirror electronic circuit. A power-supply voltage Vcc is supplied by a power supply 20 to the constant-electric-current circuit portion 15. The constant-electric-current circuit portion 15 generates a driving electric current from the supplied power-supply voltage Vcc, and supplies the driving electric current to the differential amplifying circuit portion 13, the output circuit portion 14, and the current-mirror circuit 17.

The current-mirror circuit 17 includes an NPN transistor $Q_{33}$, and PNP transistors $Q_{34}$, $Q_{35}$. The current-mirror circuit 17 controls the base electric current of the output transistor $Q_{28}$ according to the base electric current of the other output transistor $Q_{27}$. Thus, the current-mirror circuit 17 stabilizes the idling electric current flowing through the output transistors $Q_{27}$, $Q_{28}$.

Setting of the idling electric current in the output circuit portion 14 of the amplifying electronic circuit 11 will now be described. Hereinafter, the collector electric current of a transistor $Q_n$ will be referred to as $I_{Cn}$.

Electric currents $I_{C30}$, $I_{C31}$ and $I_{C32}$ supplied from the constant-electric-current circuit portion 15 are set as follows:

$$I_{C30} = 2I_{C31} = 4I_{C32} \qquad (12)$$

Electric currents $I_{C25}$, $I_{C26}$ supplied to the transistors in the output circuit portion 14 are set as follows:

$$I_{C22} = I_{C25} = I_{C26} = I_{C30}/2 \qquad (13);$$

$$I_{C27} = K_1 I_{C33} \qquad (14),$$

where $K_1$ is the current mirror ratio between the transistor $Q_{27}$ and transistor $Q_{33}$; and $$I_{C34} = K_2 I_{C35} \qquad (15)$$

where $K_2$ is the current mirror ratio between the transistor $Q_{34}$ and transistor $Q_{35}$.

With regard to the idling electric currents $I_{C27}$, $I_{C28}$, because it is possible to assume that $I_{C33}$ is approximately equal to $I_{35}$, the above equation (14) can be rewritten as:

$$I_{C27}=K_1I_{C35}.$$

Further, the above-equation (15) can be rewritten as:

$$I_{C35}=I_{C34}/K_2.$$

Thereby, the above equation (14) can be rewritten as:

$$I_{C27}=(K_1/K_2)I_{C34}.$$

Because $$I_{C34}=I_{C26}-I_{C32},$$

the idling electric current $I_{C27}$, $I_{C28}$ can be expressed as follows:

$$I_{C27}=-I_{C28}=(I_{C26}-I_{C32})\,(K_1/K_2) \quad (16).$$

Here, it is assumed that the current amplification $h_{FE}$ of the transistors is sufficiently larger than 1. That is, it is assumed that $h_{FE} \gg 1$. Thereby, a base electric current can be considered to be zero with respect to a collector electric current and a base electric current can be considered to be zero with respect to an emitter electric current.

The above equation (16) can be rewritten, using the above equations (12) and (13), into the following equation (17):

$$I_{C27}=-I_{C28}=(I_{C30}/2-I_{C30}/4)(K_1/K_2)=(K_1I_{C30})/(4K_2) \quad (17).$$

The setting shown in the equations (12) and (13) may be changed into the setting shown in the following equations (18) and (19), for example:

$$I_{C30}2I_{C31}=2I_{C32} \quad (18);$$

and $$I_{C22}=I_{C25}=I_{C26}/2=I_{C30}/2 \quad (19).$$

If the setting of equations (18) and (19) is used, the idling electric current $I_{C27}$, $I_{C28}$ are expressed as follows:

$$\begin{aligned} I_{C27} &= -I_{C28} = (I_{C26}-I_{C32})(K_1/K_2) \quad (20)\\ &= (I_{C30}-I_{C30}/2)(K_1/K_2)\\ &= (K_1I_{C30})/(2K_2). \end{aligned}$$

In the first embodiment, by changing the setting of the equations (12) to (15), the setting of the idling electric current can be changed. Thus, substantial flexibility of the setting of the idling electric current can be provided.

Figure 5:
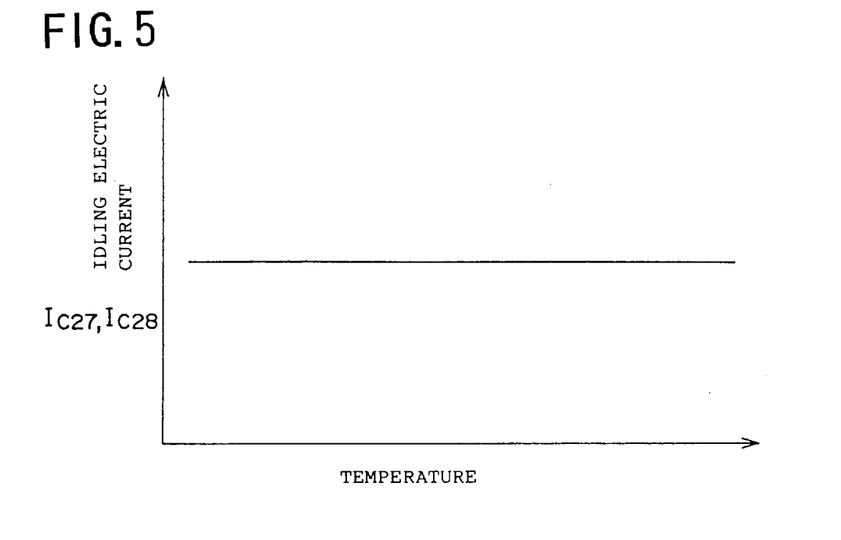
FIG.5 shows characteristics of an idling electric current with respect to the temperature of the device in the first embodiment.
Figure 6:
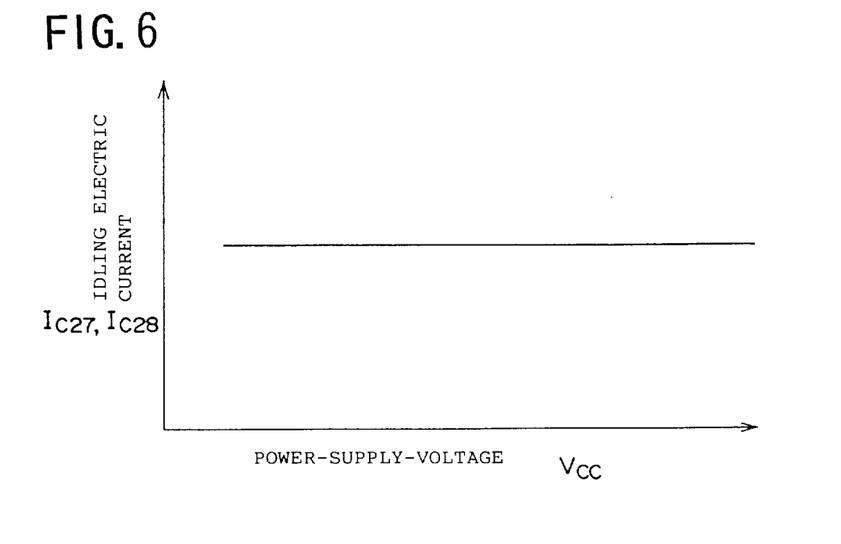
FIG.6 shows characteristics of the idling electric current with respect to a power-supply voltage in the first embodiment.

FIG.5 shows characteristics of the idling electric current with respect to the temperature of the device in the first embodiment. FIG.6 shows characteristics of the idling electric current with respect to the power-supply voltage Vcc in the first embodiment. According to the first embodiment, as shown in the equation (17), (20), the idling electric current $I_{C27}$, $I_{C28}$ is determined from the current mirror ratios $K_1$, $K_2$, and the set electric current $I_{C30}$. Because the current mirror ratios $K_1$, $K_2$ are approximately fixed without regard to the temperature of the device, power-supply voltage Vcc, the idling electric current $I_{C27}$, $I_{C28}$ can be provided, which current is stable without regard to the temperature of the device and power-supply voltage Vcc, as shown in FIGS.5 and 6, as long as the set electric current $I_{C30}$ is stable.

Figure 7:
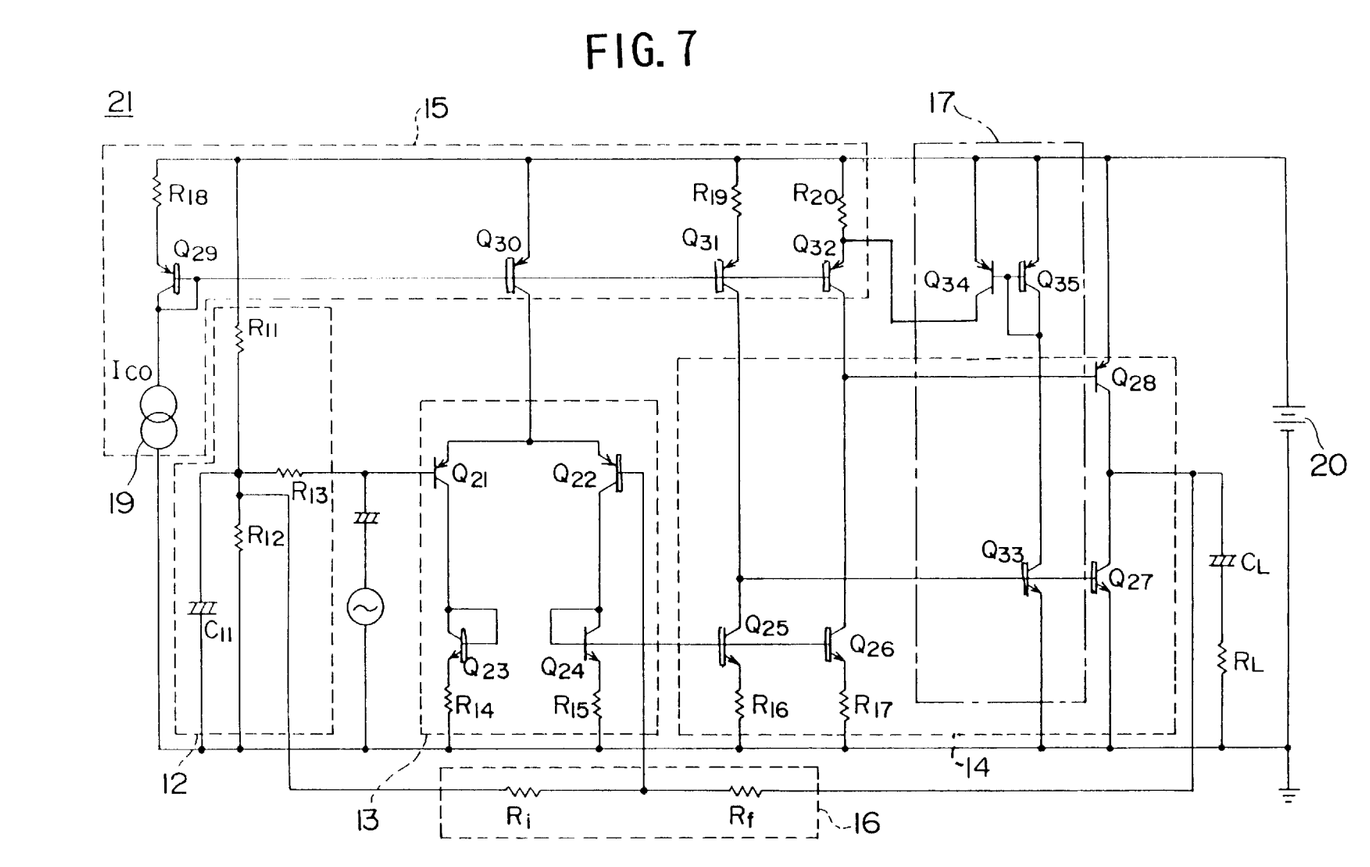
FIG.7 shows a circuit diagram of a second embodiment of the present invention.

FIG.7 shows a circuit diagram of a second embodiment of the present invention. In FIG.7, for parts/components identical to those shown in FIG.4, the same reference numerals are given and duplicated descriptions thereof will be omitted.

In an amplifying electronic circuit 21 in the second embodiment, different from the first embodiment, the collector of the transistor $Q_{34}$ of the current-mirror circuit 17 is connected to the inter-connection point of the emitter of the transistor $Q_{32}$ and the resistor $R_{20}$ in the constant-electric-current circuit portion 15, and the transistor $Q_{32}$ supplies an electric current to the output circuit portion 14. According to the second embodiment, an effect similar to that of the first embodiment can be provided. Further, it is possible to have a smaller current mirror ratio $K_2$ in the current-mirror circuit 17.

Figure 8:
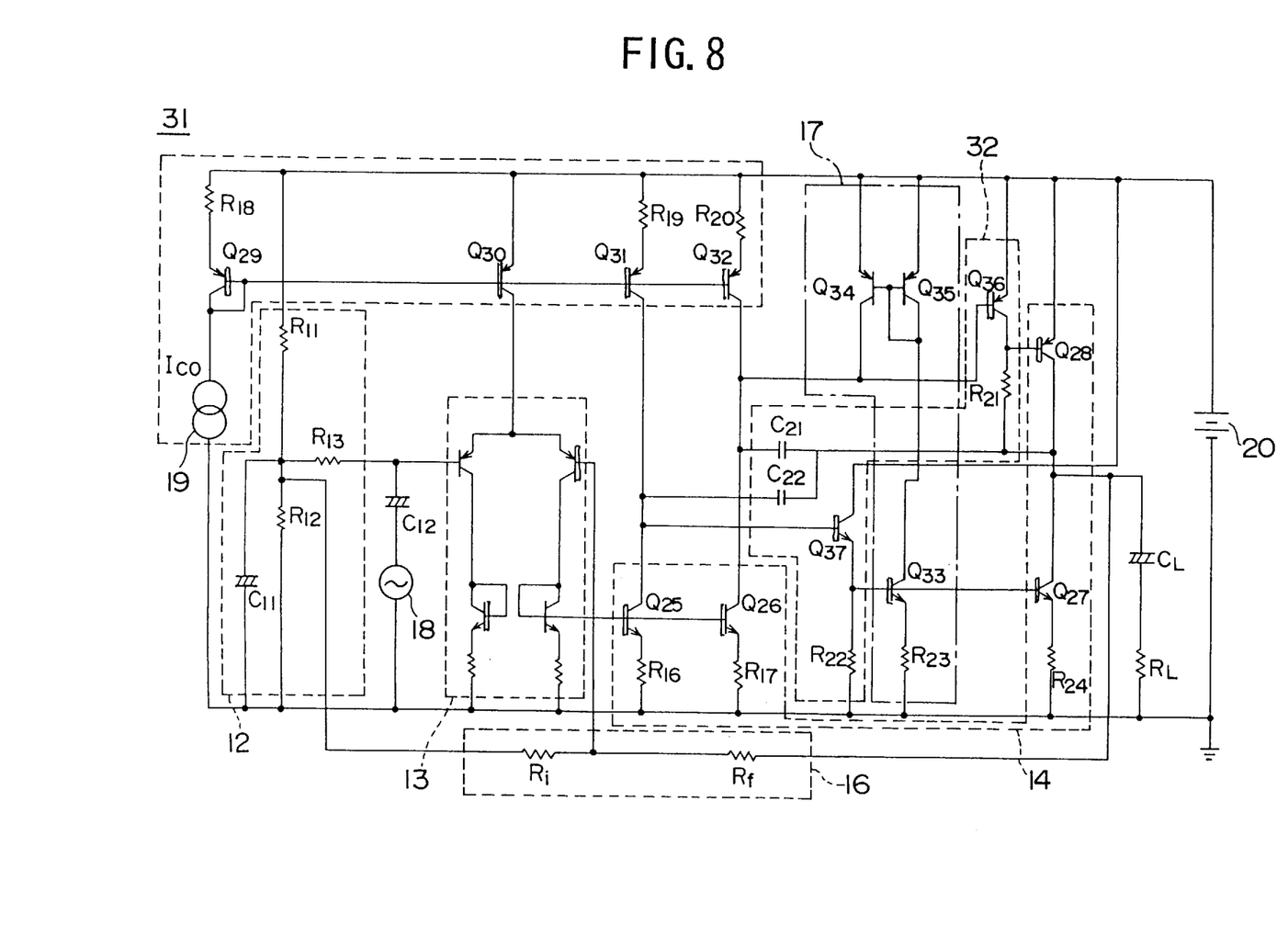
FIG.8 shows a circuit diagram of a third embodiment of the present invention.

FIG.8 shows a circuit diagram of a third embodiment of the present invention. In FIG.8, for parts/components identical to those shown in FIG.4, the same reference numerals are given and duplicated descriptions thereof will be omitted.

In an amplifying electronic circuit 31 in the third embodiment, the electronic circuit of the first embodiment has a phase control circuit 32 added for adjusting the phase of the output signal, and resistors $R_{23}$, $R_{24}$ are added in the output circuit portion 14 and the current-mirror circuit 17 respectively. Thus, the amplifying electronic circuit 31 is approximately configured as being an electronic circuit actually provided in a semiconductor integrated circuit. The phase control circuit 32 includes a PNP transistor $Q_{36}$, a NPN transistor $Q_{37}$, a phase adjusting capacitors $C_{21}$, $C_{22}$, and resistors $R_{21}$, $R_{22}$.

In the third embodiment, by setting the phase adjusting capacitors $C_{21}$, $C_{22}$ to values appropriate for a particular input signal frequency, it is possible to provide a phase of the output signal such that undesired oscillation or the like can be avoided.

The present invention is not limited to the above-described embodiments, and variations and modifications may be made without departing from the claimed scope of the present invention.

what is claimed is:

1. An amplifying electronic circuit comprising:

first and second semiconductor type transistors, said first and second semiconductor types being different from one another, are connected in series, an input signal being supplied to the base of each of said first and second transistors, a collector electric current of each of said first and second transistors being controlled, an output being provided from a connection point of said first and second transistors;

a third transistor arranged in a current-mirror relationship with said second transistor, said third transistor supplying a collector electric current equal to $1/K_1$ times said collector electric current of said second transistor, where $K_1$ is the current mirror ratio between said second and third transistors;

a fourth transistor; and a fifth transistor, said fifth transistor supplying a collector electric current which is $K_2$ times a collector electric current of said fourth transistor, where $K_2$ is the current mirror ratio between said fourth and fifth transistors, said third, fourth and fifth transistors thereby controlling a base electric current of said first transistor according to a base electric current supplied to said second transistor.

2. The amplifying electronic circuit according to claim 1, wherein said fourth transistor has its collector and base connected with one another, said fourth transistor supplying an electric current according to the collector electric current of said third transistor; and a base electric current of said fifth transistor is controlled by a base electric current of said fourth transistor, said fifth transistor supplying the collector electric current to the base of said first transistor.

3. An amplifying electronic circuit comprising:

first and second semiconductor type transistors, said first and second semiconductor types being different from one another, are connected in series, an input signal being supplied to a base of each of said first and second transistors, a collector electric current of each of said first and second transistors being controlled, an output being provided from a connection point of said first and second transistors;

a third transistor connected in a current-mirror relationship with said second transistor and which supplies a collector electric current which is $1/K_1$ times the collector electric current of said second transistor, where $K_1$ is the current mirror ratio between said second and third transistors;

a fourth transistor having a collector and base connected with one another, said fourth transistor supplying an electric current according to the collector electric current of said third transistor; and a fifth transistor, a base electric current of which is controlled by a base electric current of said fourth transistor, said fifth transistor supplying a collector electric current, which is $K_2$ times the collector electric current of said fourth transistor, to the base of said first transistor, where $K_2$ is the current-mirror ratio between said fourth and fifth transistors.

4. An amplifying electronic circuit comprising:

first and second semiconductor type active devices which are different from one another and are connected in series, an input signal being supplied to a control electrode of each of said first and second active devices, an output electric current of each of said first and second active devices being controlled, an output of said amplifying electronic circuit being provided from an inter-connection point of said first and second active devices;

a third semiconductor type active device arranged in a current-mirror relationship with said second semiconductor type active device, said third device supplying an output electric current equal to $1/K_1$ times said output electric current of said second device, where $K_1$ is the current-mirror ratio between said second and third devices;

a fourth semiconductor type active device; and a fifth semiconductor type active device supplying an output electric current which is $K_2$ times an output electric current of said fourth device, where $K_2$ is the current mirror ratio between said fourth and fifth devices, said third, fourth and fifth devices thereby controlling a control electrode electric current of said first active device according to a control electrode electric current supplied to said second active device.

5. The amplifying electronic circuit according to claim 4, wherein said fourth active device has its output electrode and a control electrode connected with one another, said fourth active device supplying an electric current according to said output electric current of said third active device; and a control electrode electric current of said fifth active device is controlled by a control electrode electric current of said fourth active device, said fifth active device supplying said output electric current to said control electrode of said first active device.

6. An amplifying electronic circuit comprising:

first and second semiconductor type active devices which are different from one another and are connected in series, an input signal being supplied to a control electrode of each of said first and second active devices, an output electric current of each of said first and second active devices being controlled, an output of said amplifying electronic circuit being provided from an inter-connection point of said first and second active devices;

a third active device connected in a current-mirror relationship with said second active device and which supplies an output electric current which is $1/K_1$ times said output electric current of said second active device, where $K_1$ is the current-mirror ratio between said second and third active devices;

a fourth active device having an output electrode and a control electrode connected with one another, said fourth active device supplying an electric current according to said output electric current of said third active device; and a fifth active device, a control electrode electric current of which is controlled by a control electrode electric current of said fourth active device, said fifth active device supplying an output electric current, which is $K_2$ times said output electric current of said fourth active device, to said control electrode of said first active device, where $K_2$ is the current-mirror ratio between said fourth and fifth active devices.

\* \* \* \* \*